350-96.12 $$$ SR
E197Y XR 4,065,730
IX 96.12

United Sta[tes Patent] [11] 4,065,730
Minden [45] Dec. 27, 1977

[54] LASER OPTICAL COUPLER

[75] Inventor: Henry T. Minden, Concord, Mass.

[73] Assignee: Sperry Rand Corporation, New York, N.Y.

[21] Appl. No.: 694,852

[22] Filed: June 10, 1976

[51] Int. Cl.[2] .............................................. H01S 3/19
[52] U.S. Cl. ......................... 331/94.5 H; 331/94.5 C; 350/96 WG
[58] Field of Search ..................... 331/94.5 H, 94.5 C; 350/96 WG

[56] References Cited

U.S. PATENT DOCUMENTS

| | | | |
|---|---|---|---|
| 3,760,297 | 9/1973 | Thompson | 331/94.5 C |
| 3,949,320 | 4/1976 | Castleberry | 331/94.5 C |

*Primary Examiner*—Stanley D. Miller, Jr.
*Assistant Examiner*—James W. Davie
*Attorney, Agent, or Firm*—Howard P. Terry

[57] ABSTRACT

Light is efficiently coupled from a laser into a dielectric optical wave guide without the use of additional optical components. An oscillating mode using total internal reflection within the laser element is employed, one face of the element intimately contacting a wave guide light output coupling wall.

8 Claims, 5 Drawing Figures

LASER OPTICAL COUPLER

BACKGROUND OF THE INVENTION

1. Field of the Invention

The invention generally relates to simple, efficient means for coupling the light output of a laser into utilization apparatus. In particular, coupling is made directly through a contiguous broad wall of the wave guide, and no additional optical components such as lenses, fibers, or gratings are needed.

2. Description of the Prior Art

The direct light beam produced by known prior art semiconductor diode lasers is inherently relatively divergent with respect to the light beam from a conventional gas laser, for example, so that lenses are normally required to collect, collimate, and focus the diode laser light beam. Flat optical fiber bundles have also been used to collect light from semiconductor lasers; once the light is collected by such fiber bundles, it may be coupled to a thin film wave guide by butting the output end of the bundle against the edge of the wave guide. The use of miniature cylindrical or spherical lenses has been suggested as a more direct means of coupling semiconductor lasers to optical wave guides.

However, each of the known prior art coupling systems has one or more defects. Above all, any use of a macroscopic element with a semiconductor laser, which is inherently a miniature device, defeats the objective of fully retaining its miniature character. Any use of prisms, tapers, gratings, or the like at once reduces the possibility of a miniature design fully suited to manufacture by the application of known microcircuit techniques. While such couplers are generally effective in collecting the laser light, the coupling function is performed in an inefficient manner.

SUMMARY OF THE INVENTION

The invention is an improvement in the art of usefully coupling light energy generated in a semiconductor laser device into a substrate-supported thin film optical wave guide or into a thick film guide. According to the invention, light is efficiently and directly coupled from a laser device into a dielectric optical wave guide, and the coupling is accomplished without the intervention of any additional optical component. An oscillating laser mode using total internal reflection within the laser body is employed, one face of the latter intimately contacting a wave guide light-coupling broad wall. While a principal embodiment of the invention utilizes a modified semiconductor injection laser, the invention may be applied to any laser in which the radiation is confined in a flat plane, as in an optically pumped laser chip.

DESCRIPTION OF THE PREFERRED EMBODIMENTS

Figure 1:
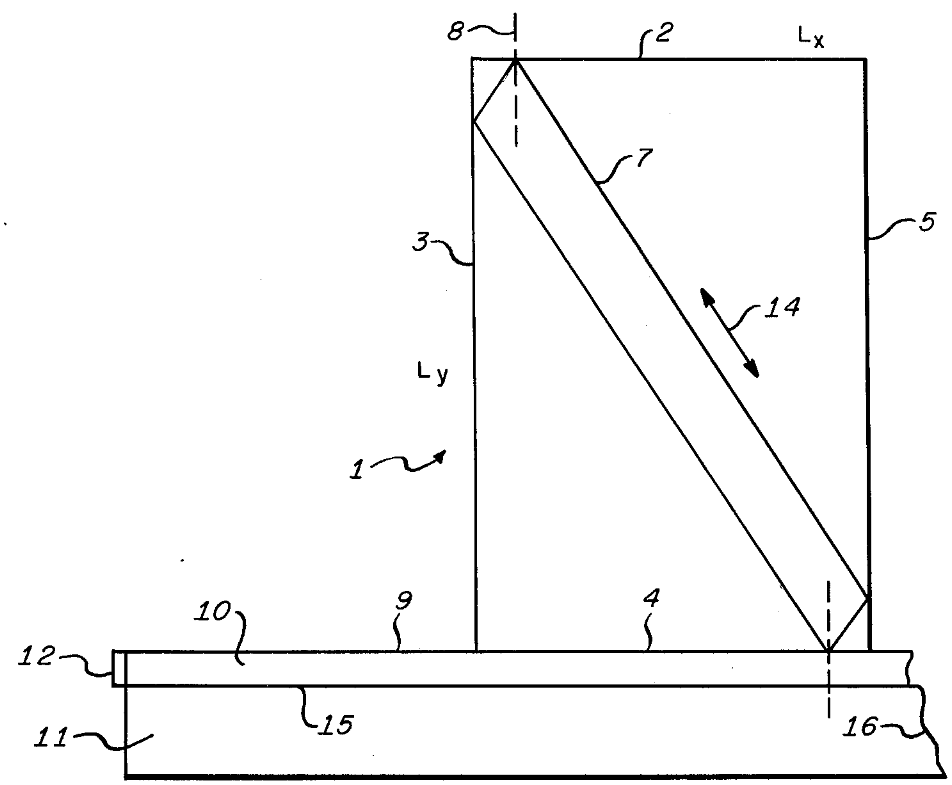
FIG. 1 is an elevation view illustrating the general form of the invention.
Figure 2:
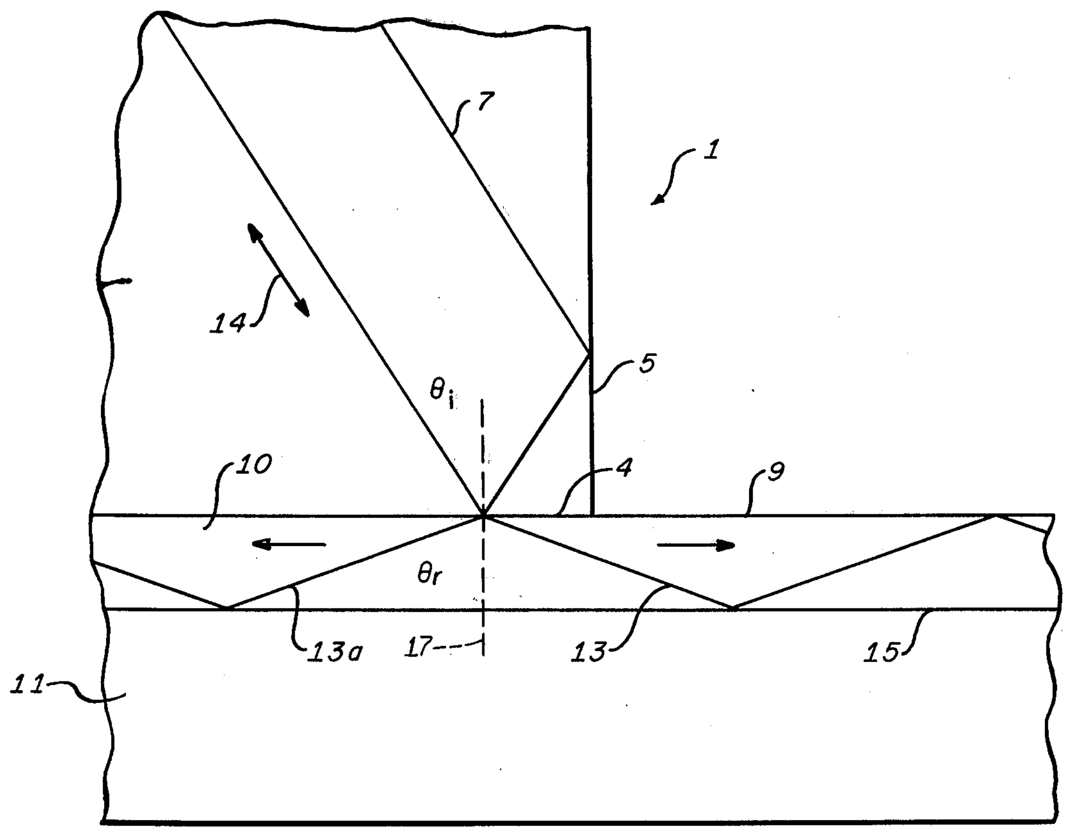
FIG. 2 is a view of an enlarged portion of FIG. 1 for use in explaining light ray paths.
Figure 5:
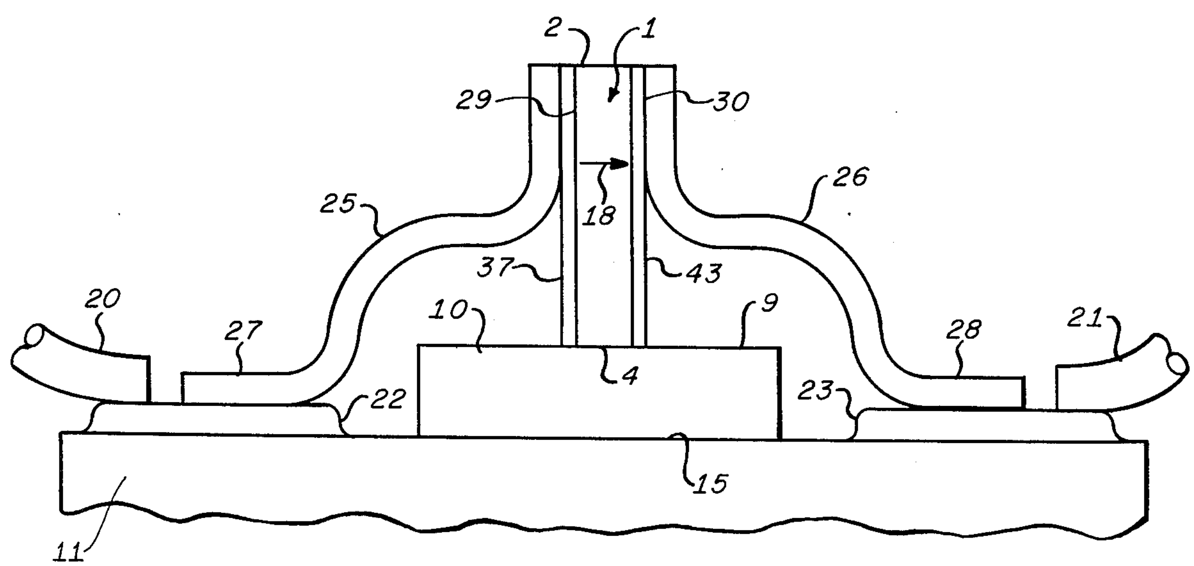
FIG. 5 is an elevation view of a preferred form of the invention.

FIGS. 1 and 2 will be instrumental in providing an understanding of how the design of a representative practical embodiment of the novel device, such as that of FIG. 5, may be derived. In FIG. 1, a right rectangular parallelepiped crystalline semiconductor laser slab or chip 1 is selected which may be of a generally conventional type such as the typical multilayer single heterojunction GaAs laser diode described by H. T. Minden and R. Premo in their *Journal of Applied Physics* paper "High Temperature GaAs Single Heterojunction Laser Diodes," page 4520, October 1974. Other single heterojunction devices, as well as multiple heretojunction devices widely described in the literature, may alternatively be employed. InAs, InP, and GaAs and other semiconductor compounds having a direct band gap may be employed, generally including materials referred to in the art as type III – V compounds, as well as other compounds. The laser chip 1 is preferably formed as a right angled slab whose opposed parallel faces 3, 5 and 2, 4 are formed in the conventional manner by specularly cleaving an epitaxially formed crystal along its 110 crystallographic faces after the two broad faces are lapped for smoothness. As in the typical case, the slab or chip 1 has originally been formed by liquid phase epitaxial step-by-step deposition of the successive layers of the variously doped GaAs or other materials conventionally required for laser operation. One of the internal layers acts as a bidirectional light energy propagating wave guide in the usual manner, and has a characteristic index of refraction $n_s$. It will be understood that the cleaved surfaces 3, 5 and 2, 4 cooperate with the internal laser light propagating layer or wave guide and form the Fabry-Perot mirrors of an internal mode laser cavity.

The width of faces 2, 4 of laser chip or slab 1 is $L_x$, while the height of faces 3, 5 is $L_y$. The face 4 of width $L_x$ is placed, according to the invention, in intimate contact with the exposed polished face 9 of a transparent thin dielectric film wave guide 10. In the filamentary mode of oscillation, the simple closed path 7 is taken by the light energy in the laser internal wave guide, the light flowing equally in two directions as indicated by the double-headed arrow 14. In this mode, the light is successively reflected from the succession of faces 2, 3, 4, 5; for example, the light is totally internally reflected at the point 8 of face 2, and so on. It is seen in FIG. 2 that the angle of incidence $\theta_i$ on face 4 is $\tan^{-1}(L_x/L_y)$. Operation in this mode is ideally without escape of radiation at the three air interfaces and depends upon the relative magnitudes of the major dimensions $L_x$ and $L_y$. Thus, total internal reflection obtains when:

$$\sqrt{(n_s^2 - 1)} > L_y/L_x \quad (1)$$

Where the semiconductor device 1 is constructed of GaAs, the index of refraction $n_s$ is about 3.6.

On the other hand, light is to be coupled according to the invention out of face 4 into the external wave guide 10 and there should be relatively low internal reflection from face 4. The wave guide 10 is composed of a known transparent dielectric material, such as $Nb_2O_5$, $Ta_2O_5$, or mixtures thereof, generated by a conventional pyrolytic method, and having a characteristic index of refraction $n_o$ which may be about 2.0. Therefore, conditions at interface 4 are defined by:

$$L_y/L_x > \sqrt{(n_s/n_o)^2-1} \quad (2)$$

These and other suitable materials having useful indices of refraction are widely described in the literature, including materials such as silicon nitride, silicon oxynitride, silicon-rich silicon nitride, or silicon-rich silicon oxynitride, or mixtures thereof, materials which will herein be generally classified as nitrides of silicon. Controlled methods for the formation of layers of such material are taught in U.S. Pat. No. 3,573,096, issued Mar. 30, 1971 to N. C. Tombs for a "Silane Method of Making Silicon Nitride," and assigned to Sperry Rand Corporation. Also of interest are the N. C. Tombs U.S. Pat. No. 3,422,321, issued Jan. 14, 1969 for "Oxygenated Silicon Nitride Semiconductor Device and Silane Method of Making Same" and the R. I. Frank and W. L. Moberg U.S. Pat. No. 3,629,088, issued Dec. 21, 1971 for "Sputtering Method for Deposit of Silicon Oxynitride," both patents being assigned to Sperry Rand Corporation. Since, in typical materials such as those described herein $n_s > n_o$, the light emerging through face 4 of laser chip 1 is beneficially refracted into the plane of wave guide 10, as indicated at 13. The angle of refraction $\theta_r$ with respect to the vertical reference line 17 is readily predicted from Snell's law:

$$\sin\theta_r/\sin\theta_i = n_s/n_o \quad (3)$$

It is seen that by natural consequence the angle of refraction $\theta_r$ is also the angle at which light becomes incident upon the interface 15 between wave guide 10 and the planar substrate 11, which latter may be composed of a material like quartz. At interface 15, the light is again to be totally internally reflected for continued propagation down wave guide 10 by a continuing progression of internal total reflections alternating from faces 9 and 15 of guide 10. For this purpose:

$$L_y/L_x < \sqrt{n_s/n_q^2-1} \quad (4)$$

at interface 15. Here, the value $n_q$ is the index of refraction of substrate 11, which is about 1.5 if a fused quartz substrate is employed. Combining the inequalities (1), (2), and (4) yields:

$$n_s^2-1 > (n_s/n_q)^2-1 > (L_y/L_x)^2 > (n_s/n_o)^2-1 \quad (5)$$

By simple trial substitution of values, it is readily demonstrated that the inequalities (5) are satisfied if $2 > L_y/L_x > 1.5$ where the aforementioned materials are employed.

It will be understood that the laser diode and therefore the novel coupler are bidirectional and that two, equal-amplitude, but oppositely directed rays 13, **13*a* are formed. If only the ray 13 is used, the coupler presents a 3dB. loss of the light energy actually generated by laser 1. This loss is readily recovered, however, by placing an optical reflecting film 12 so that the direction of flow of ray 13*a* in guide 10 is usefully reversed (FIG. 1). It is further to be understood that the arrangement of FIG. 1 may be part of an optical system in which the substrate 10 provides a common base for other optical or electrical components and wave guide 10 and substrate 11 may be of extended length beyond location 16** for interconnecting them.

Figure 3:
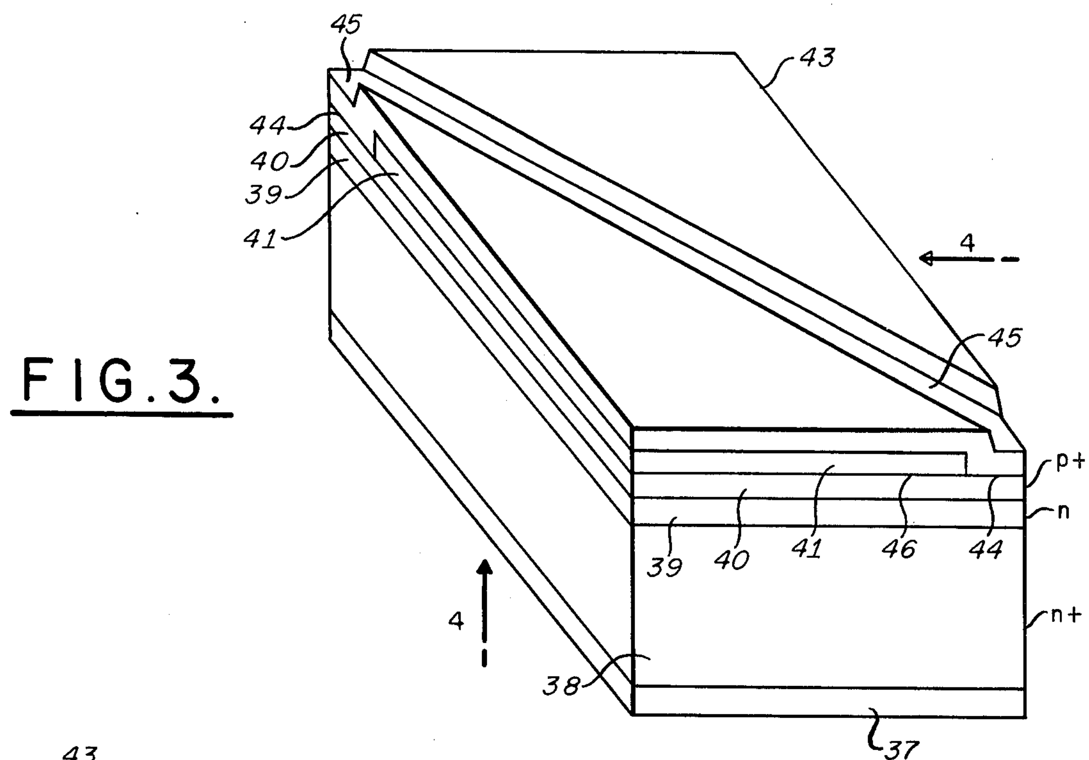
FIG. 3 is a perspective view of the novel laser diode used in the apparatus of FIG. 1.
Figure 4:
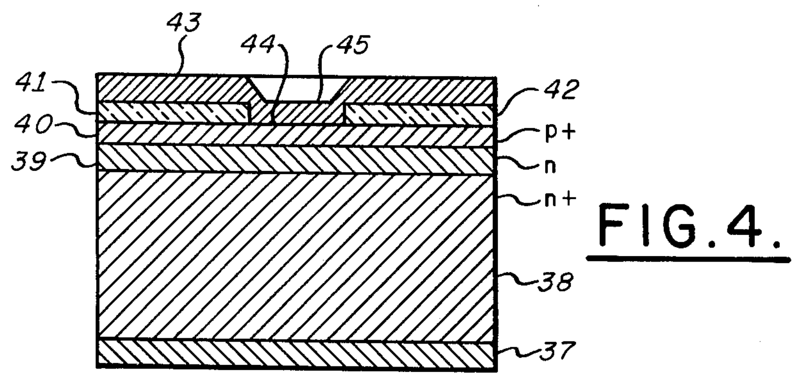
FIG. 4 is a cross-section view taken along the line 4—4 of FIG. 3.

FIGS. 3 and 4 illustrate one way in which the operation of laser 1 may be constrained to permit the presence of only the preferred diagonal mode indicated by path 7 in FIGS. 1 and 2; it is understood that path 7 is preferred so as to ensure that the light rays 13, **13*a* will continue to propagate by total internal reflection within the external wave guide 10**. For this purpose, a novel modification may be made of a GaAs junction laser described in the technical paper "Hermite-Gaussian Mode Patterns in GaAs Junction Lasers" by J. C. Dyment, *Applied Physics Letters,* page 84, Feb. 1, 1967. In a generally conventional manner, the laser includes an ohmic base contact 37 to which the active semiconductor body is affixed. The latter may take the form of a p+-n-n+ GaAs diode with optical radiation generated within a type n layer 39 sandwiched between a low resistivity type n+ layer 38 and a low resistance type p+ layer 40. The second ohmic contact 43 is made to the outer surface 46 of type p+ layer 40.

Whereas prior art devices have universally formed ohmic contact 43 to confine the active portion of the laser junction to a narrow but exactly symmetrically disposed location by localized injection under a narrow strip contact, the present invention provides a novel asymmetric or diagonal configuration, making efficient excitation of the external wave guide possible.

The modification is effected by constructing the diode generally using conventional techniques, but achieving an improved configuration for the second ohmic contact 43. When the type p+ semiconductor layer 40 has been formed and its surface 46 appropriately prepared, a layer of insulating material such as silicon dioxide is formed to a depth of about 1500 Angstroms on that surface 46. The layer 41 covers the type p+ surface 46 except for a narrow stripe running diagonally across that surface 46, where the formation of the insulating layer is inhibited in any suitable conventional manner. Alternatively, type p+ layer 40 may be fully coated with a silicon dioxide layer and the diagonal stripe then etched away. The type p+ surface is bare only above the diagonal region where it is desired to have active lasing occur. The insulating layer parts 41, 42 and the diagonal strip 44 of the surface of the type p+ layer are than continuously covered by a conventional technique with the second ohmic contact 43 which may be of an electrically conducting metal, using any convenient conventional process.

It is seen in FIG. 3 that the actual ohmic contact 44 progresses diagonally across the structure from the front face at 44 in the figure to an opposite corner at the back of the structure. At a location half way between the front and rear faces of FIG. 3, a cross-section has the appearance of FIG. 4. Here the narrow ohmic contact 44 below depression 45 reaches down through its supporting triangular insulating layers 41 and 42 to form the actual strip contact at 44 with the type p+ layer 40. In this manner, the light-producing mechanism is constrained to operate only in the desired diagonal region, and the desired diagonally disposed light ray path 7 is excited for efficient injection into the external wave guide 10.

It will be understood that configurations other than the illustrated configuration for confining the lasing region to a narrow stripe disposed at the appropriate angle to the cleaved face 4 of the laser may be employed. For example, a more recent constraint system is the mesa-stripe geometry formed by a mesa-etching method. It will be apparent to those skilled in the art that other mode constraining systems may readily be adapted for use according to the invention and therefore logically fall within its scope.

Referring now also to FIG. 5, which provides an end-on-end view of the novel device showing the output wave guide 10, a representative embodiment of the invention will be further discussed. In FIG. 5, an extended fused quartz substrate 11 is provided, with wave guide 10 again formed on surface 15 thereof. The semiconductor laser 1 is mounted on guide 10 for providing the desired coupling interface 4. In the drawing, interface 4 couples the generated light up and out of the guide 10 toward the viewer's eye.

As is conventional practice, the power needed to promote laser action in the semiconductor slab 1 is produced by causing electrical current flow through the slab in the direction of arrow 18 in FIG. 5. For this purpose, the conventional semiconductor laser is equipped in FIG. 5 with outer contacting ohmic layers, such as layers 37 and 43, to which electrical contacts may be made in the conventional manner. In the embodiment of FIG. 5, shaped wires or strips 25 and 26, respectively, are fastened to conventional ohmic contacts such as 22 and 23 on the extended surface 15 of substrate 11. The wires or conductive strips 25, 26 may be joined at 27 and 28 to contacts 22, 23 by thermocompression bonding, soldering, or by other conventional and well known methods. They may be similarly bonded at 29 and 30 to the respective contact surfaces 37, 43. A conventional power supply may provide suitable electrical currents for continuous or pulsed operation of laser 1*a* via leads 20, 21.

Wires or strips 25, 26 may take various forms, including strips having spring stiffness sufficient to force the laser slab 1 firmly at interface 4 against the upper surface 9 of wave guide 10. The laser slab 1 may be directly affixed to surface 9 by the use of a conventional quick setting epoxy material. The interfaced surfaces at 4 will be previously polished to substantially optically smooth perfection; i.e., so that the maximum separation of the wave guide 10 and the semiconductor slab 1 is not more than a tenth of a wave length for the operating light.

The figures illustrate desired novel features of the invention whereby an improvement is provided in the art for usefully and efficiently coupling light energy internally generated in a semiconductor laser diode directly into a substrate-supported thin film dielectric wave guide. Light is directly coupled from the laser diode into the external output wave guide, the coupling being achieved without the use of space consuming lenses or other macroscopic optical elements.

While the invention has been described in its preferred embodiments, it is understood that the words which have been used are words of description rather than limitation, and that changes within the purview of the appended claims may be made without departure from the true scope and spirit of the invention in its broader aspects.

I claim:

1. Laser apparatus comprising:

a laser diode having a right rectangular parallelipiped semiconductor body, said body having a layer wherein laser light is generated disposed between first and second opposed major rectangular surfaces of said body, said body having a cleaved light-emitting surface disposed at right angles to said opposed major rectangular surfaces, first and second electrical contacts disposed respectively directly on said opposed major rectangular surfaces of said semiconductor body, said first contact being so disposed on said first opposed major rectangular surface as to inhibit light generation except in a parallelogram located at the diagonal of said right rectangular parallelipiped semiconductor body within the light generating layer, only one corner of said parallelogram contacting said cleaved light-emitting surface, said parallelogram having a length substantially equal to said diagonal and a width substantially smaller than said length, and a dielectric optical wave guide having first and second planar broad walls, said first planar broad wall being in optical contact with said cleaved light-emitting surface whereby a major portion of said laser light is refracted at said cleaved surface into said dielectric optical wave guide for propagation therein by successive total reflections.

2. Apparatus as described in claim 1 wherein said right rectangular semiconductor body is further bounded by second, third, and fourth cleaved surfaces disposed at right angles to said opposed major rectangular surfaces for confining said laser light within said parallelogram by total internal reflection within said light generating layer.

3. Laser apparatus comprising:

a laser diode having a right rectangular parallelepiped semiconductor body, said body having *a* layer *wherein laser light is generated* disposed between opposed first and second major surfaces of said body, said body having first and second diagonally opposed corner*s*, said body additionally having *a* first cleaved surface disposed at right angles to said first and second major surface*s* and partially bounded by said first corner, first and second electrical contact*s* disposed respectively directly on said opposed first and second major surface*s*, said first electrical contact comprising an electrically conductive strip extending diagonally from said first to said second diagonally opposed corner*s*, and a dielectric optical weave *guide* having first and second planar broad wall*s*, said first planar broad wall being in optical contact with said first cleaved surface whereby a major portion of said laser light incident upon said cleaved surface is refracted at said first corner into said dielectric optical wave guide for propagation therein by successive total reflections.

4. Apparatus as described in claim 3 wherein said right rectangular parallelepiped semiconductor body is further bounded by second, third, and fourth cleaved surfaces disposed at right angles to said first and second major surfaces for confining said laser light by total internal reflection.

5. Apparatus as described in claim 4 wherein said second electrical contact covers substantially the total of said second major surface.

6. Apparatus as described in claim 5 wherein said dielectric optical wave guide comprises a pyrolytically formed layer of a material selected from the group consisting of $Nb_2O_5$, $Ta_2O_5$, and mixtures thereof.

7. Apparatus as described in claim 6 including a dielectric substrate affixed to said second planar broad wall of said dielectric optical wave guide opposite said first broad wall.

8. Apparatus as described in claim 7 wherein:

said dielectric substrate is composed of quartz, and said right rectangular parallelepiped semiconductor body is composed substantially of GaAs semiconductor material.

* * * * *